United States Patent
Yu

[11] Patent Number: 6,025,239
[45] Date of Patent: *Feb. 15, 2000

[54] METHOD FOR FABRICATING AN ELECTROSTATIC DISCHARGE DEVICE

[75] Inventor: Ta-Lee Yu, Hsinchu Hsien, Taiwan

[73] Assignee: Winbond Electronics Corp., Taiwan

[ * ] Notice: This patent issued on a continued prosecution application filed under 37 CFR 1.53(d), and is subject to the twenty year patent term provisions of 35 U.S.C. 154(a)(2).

[21] Appl. No.: 09/027,572

[22] Filed: Feb. 23, 1998

[30] Foreign Application Priority Data

Oct. 23, 1997 [TW] Taiwan ................................. 86115727

[51] Int. Cl.⁷ .................................................. H01L 21/336
[52] U.S. Cl. ......................... 438/302; 438/306; 438/514; 438/527
[58] Field of Search ...................................... 438/514, 527, 438/546, 200, 231, 232, 303, 305, 306, 307, 371, 529, 545, 230, 301, 308

[56] References Cited

U.S. PATENT DOCUMENTS

| | | | |
|---|---|---|---|
| 5,015,598 | 5/1991 | Verhaar | 438/304 |
| 5,015,599 | 5/1991 | Verhaar | 438/304 |
| 5,308,780 | 5/1994 | Chou et al. | 437/44 |
| 5,416,036 | 5/1995 | Hsue | 437/51 |
| 5,512,769 | 4/1996 | Yamamoto | 257/339 |
| 5,534,723 | 7/1996 | Iwai et al. | 257/360 |
| 5,571,737 | 11/1996 | Sheu et al. | 437/44 |
| 5,593,907 | 1/1997 | Anjum et al. | 437/35 |
| 5,672,527 | 9/1997 | Lee | 437/41 |
| 5,747,373 | 5/1998 | Yu | 438/305 |
| 5,770,508 | 6/1998 | Yeh et al. | 438/305 |
| 5,776,806 | 7/1998 | Dennison et al. | 438/199 |
| 5,793,090 | 8/1998 | Gardner et al. | 257/408 |

OTHER PUBLICATIONS

Toyoshima, Y.; Profiled Lightly Doped Drain (PLDD) Structure for High Reliable NMOS–FETs; 1985 Symposium on VLSI Technology–Digest of Technical Papers, pp. 118–119.
Wolf, Stanley; Silicon Processing for the VLSI Era: vol. 3: The Submicron MOSFET, Lattice Press, Sunset Beach, CA, Jan. 1995, p. 616–621.

Primary Examiner—John F. Niebling
Assistant Examiner—Christopher Lattin
Attorney, Agent, or Firm—Fish & Richardson P.C.

[57] ABSTRACT

A method for fabricating an electrostatic discharge device is disclosed. The method forms successively a gate dielectric layer and a gate electrode over a semiconductor substrate. The gate electrode is then utilized as a mask for a first ion implantation for forming a first lightly-doped region in the substrate. Moreover, a second ion implantation step is carried out, using the gate electrode as a mask, to form a second lightly-doped region under the first lightly-doped region in the substrate. A sidewall spacer is then formed on sidewall of the gate electrode. Finally, using the sidewall spacer and the gate electrode as a mask, a third ion implantation step is carried out to form a heavily-doped region in the substrate.

17 Claims, 7 Drawing Sheets

6,025,239

METHOD FOR FABRICATING AN ELECTROSTATIC DISCHARGE DEVICE

BACKGROUND OF THE INVENTION

1. Field of the Invention

The invention relates to a method for fabricating a semiconductor integrated circuit, and more specifically, to a method for fabricating an electrostatic discharge device.

2. Description of Related Art

The dimensions of a transistor has largely reduced due to the development of semiconductor technology. More transistors can therefore be assembled within a single chip of limited area to improving the function. However, the reduction of transistor dimensions brings new problems which must be overcome by novel techniques. For example, for a transistor having a channel length of shorter than 1.2 m, carriers with high energy will exist near the drain junction where strong local field is generated. It is probably that these carriers, known as "hot carriers," are driven into the gate oxide layer by a lateral electric field when the gate electrode is biased. As the hot carriers gradually enter and accumulate inside the gate oxide layer, the transconductance of the transistor reduces and the threshold voltage increases, thereby affecting the performance of the transistor.

A lightly-doped drain (LDD) transistor structure has been provided for overcoming the aforementioned hot-carrier effect. Referring to FIG. 1, a LDD transistor is fabricated in a semiconductor substrate 1. The transistor includes a gate oxide layer 10, a gate electrode 11, a sidewall spacer 13, lightly-doped drain/source regions 12 and heavily-doped drain/source regions 14. The gate electrode 11 lies over the gate oxide layer 10, and is isolated from the drain/source regions 12 and 14 by the gate oxide layer 10 and spacer 13. The gate electrode 11, when biased, induces a channel under the gate oxide layer 10 in the substrate 1, thereby electrically connecting the two drain/source regions 12.

The lightly-doped drain/source regions 12 have a same conductivity type (N-type or P-type) as the heavily-doped drain/source regions 14. They are different in their dopant concentrations. The lightly-doped drain/source regions can therefore reduce strength of the local field to prevent the hot-carrier effect. However, as an electrostatic discharge device, a large amount of discharging current crowding in the lightly-doped drain/source regions seriously affects the discharging capability of the transistor. That is, the conventional LDD transistor cannot be a good electrostatic discharge device.

Accordingly, the structure of an LDD transistor must be modified if provided as an electrostatic discharge device. The method for fabricating a conventional electrostatic discharge device will be described in accompaniment with the drawings of FIG. 2A through FIG. 2D. Referring to FIG. 2A, a gate dielectric layer 211 and a gate electrode 212 are successively formed over the substrate of an ESD region 210, whereas a gate dielectric layer 221 and a gate electrode 212 are formed over the substrate of an internal circuit region 220. An ion implantation step is then carried out, using the gate electrodes 212 and 222 as masks, to form lightly-doped source/drain regions 213 and 223 in the substrate 2 of the ESD region 210 and internal circuit region 220, respectively.

Further referring to FIG. 2B, sidewall spacers 214 and 224 are formed on sidewalls of the gate electrode 212 and gate electrode 222, respectively. These sidewall spacers 214 and 224 and the gate electrodes 212 and 222 are then utilized as masks of a second ion implantation step. Referring to FIG. 2C, the second ion implantation step forms heavily-doped source/drain regions 215 and 225 in substrate 2 of the ESD region 210 and internal circuit region 220, respectively.

Referring to FIG. 2D, the internal circuit region 220 is then covered by a photoresist layer 226. A third ion implantation step is carried out, using the gate electrode 212 as a mask, to form a diffusion region 216 in the substrate 2 of the exposed ESD region 210. The diffusion region 216 must cover both the lightly-doped region 213 and the heavily-doped region 215. Since ions must be implanted through the sidewall spacer 214 to cover the lightly-doped region 213 in the substrate 2, a more expensive high implantation energy is required. The high implantation energy also increases the probability of contamination. Moreover, the high-energy implantation may damage the gate electrode, thus causing leakage current.

Another conventional method for fabricating an electrostatic discharge device, as disclosed in U.S. Pat. Nos. 5,529,941 and 5,416,036, will be described in accompaniment with FIG. 3A through FIG. 3D. Referring to FIG. 3A, a gate dielectric layer 311 and a gate electrode 312 are successively formed over the substrate of an ESD region 310, whereas a gate dielectric layer 321 and a gate electrode 322 are formed over the substrate of an internal circuit region 320. An ion implantation step is then carried out, using the gate electrodes 312 and 322 as masks, to form lightly-doped source/drain regions 313 and 323 in the substrate 3 of the ESD region 310 and internal circuit region 320, respectively.

Further referring to FIG. 3B, sidewall spacers 314 and 324 are formed on sidewalls of the gate electrode 312 and gate electrode 322, respectively. Referring to FIG. 3C, a photoresist layer 325 is formed over the internal circuit region 320. The exposed sidewall spacer 314 in the ESD region is then removed by etching. After removing the photoresist layer 325, referring to FIG. 3D, an ion implantation step is carried out to form heavily-doped regions 316 and 326 in the substrate 3 of the ESD region 310 and internal circuit region 320, respectively, by using the gate electrodes 312 and 322 and the sidewall spacer 324.

This method fabricates a non-LDD device in the ESD region. The electrostatic discharge capacity can therefore be improved. However, the hot-carrier effect and short-channel effect will still occur therein. Moreover, the additional etching step for removing the sidewall spacer 314 may affect the conformity of the gate dielectric layer.

SUMMARY OF THE INVENTION

Accordingly, the invention provides a method for fabricating an electrostatic discharge device without high-energy ion implantation, thereby reducing manufacturing cost and preventing contamination.

The invention provides a method for fabricating an electrostatic discharge device without any additional etching step for removing a sidewall spacer, thereby improving the conformity of the gate dielectric layer.

The method of the invention forms successively a gate dielectric layer and a gate electrode over a semiconductor substrate. The gate electrode is then utilized as a mask for a first ion implantation for forming a first lightly-doped region in the substrate. Moreover, a second ion implantation step is carried out, using the gate electrode as a mask, to form a second lightly-doped region under the first lightly-doped region in the substrate. A sidewall spacer is then formed on sidewall of the gate electrode. Finally, using the sidewall spacer and the gate electrode as a mask, a third ion implantation step is carried out to form a heavily-doped region in the substrate.

Since no additional etching step for removing the sidewall spacer is required in the invention, the gate dielectric layer has higher conformity. As the second lightly-doped region is formed under the first one before the formation of the sidewall spacer, the second ion implantation can be carried out with lower dosage at a lower energy. Therefore the manufacturing cost is reduced. Moreover, since the electrostatic discharge device of the invention has an LDD structure, the hot carrier effect and the short channel effect can be prevented.

DETAILED DESCRIPTION OF THE INVENTION

The preferred embodiment of the invention will be described in accompaniment with the drawings of FIG. 4A through FIG. 4D. For clarity, an ESD region 410 and an internal circuit region 420 are both illustrated in each of the figures for comparison. The method of the invention can be applied to fabricate an N-type electrostatic discharge device as well as a P-type device. The embodiment, however, demonstrates an N-type device. Therefore, a P-type semiconductor or a P-well in an N-type semiconductor can be utilized as a substrate 4 in the embodiment.

Figure 1:
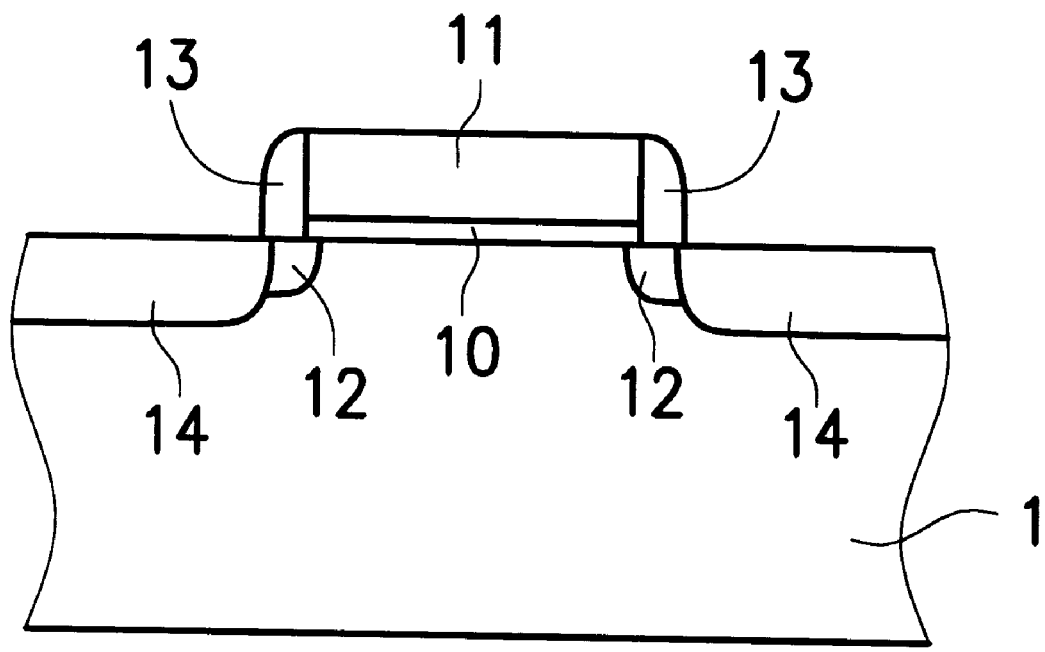
FIG. 1 is a cross-sectional view of a conventional LDD transistor.
Figure 2A:
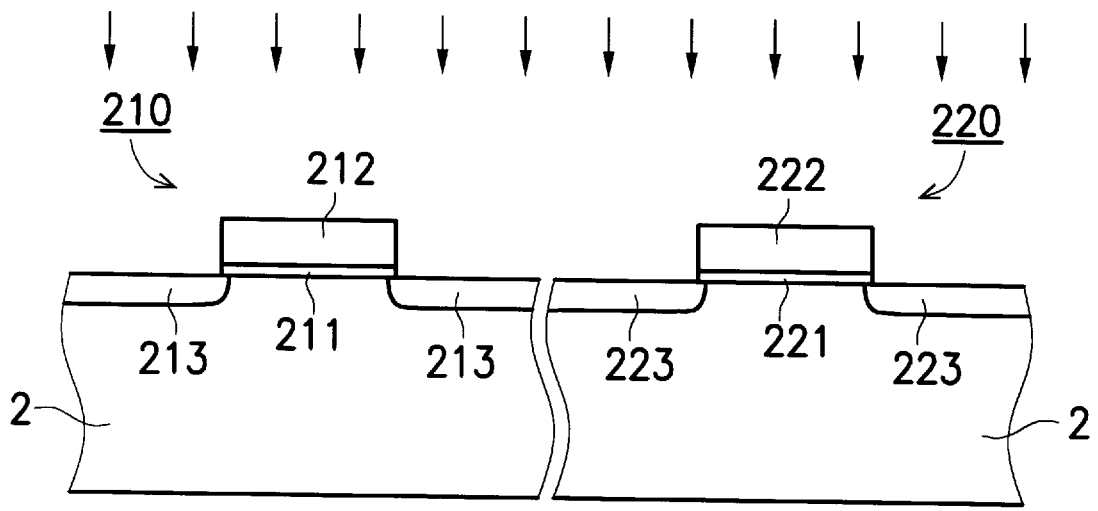
FIG. 2A through FIG. 2D are cross-sectional views illustrating steps for fabricating a conventional LDD transistor.
Figure 2B:
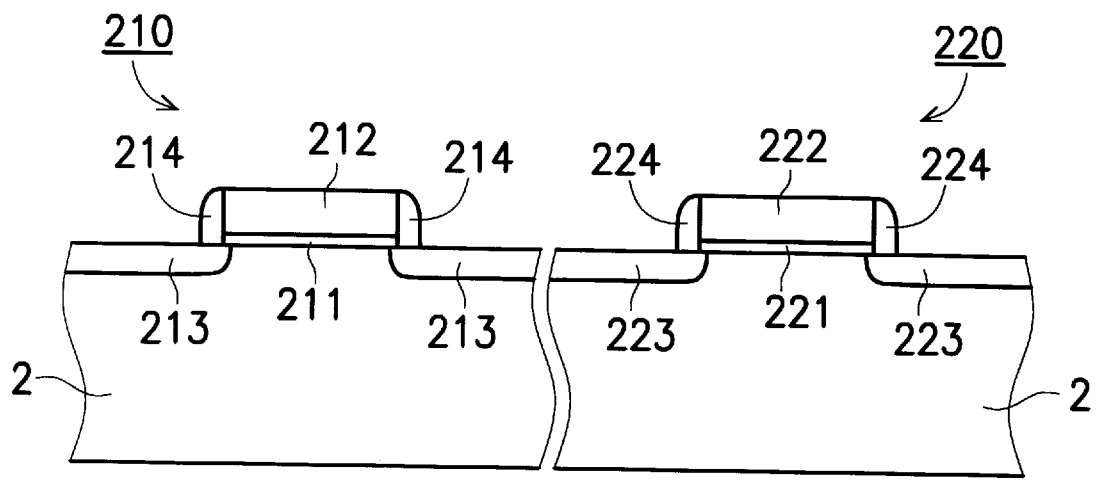
Figure 2C:
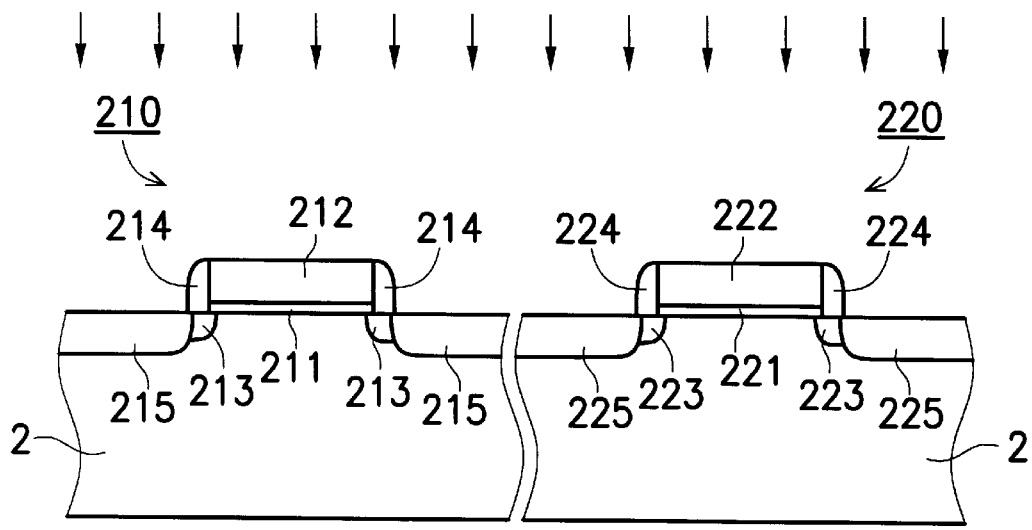
Figure 2D:
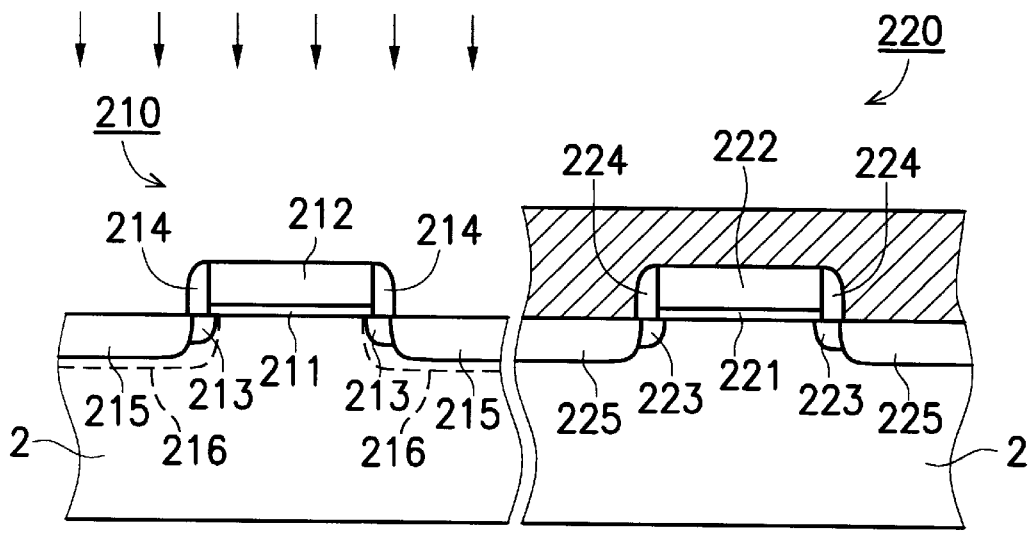
Figure 3A:
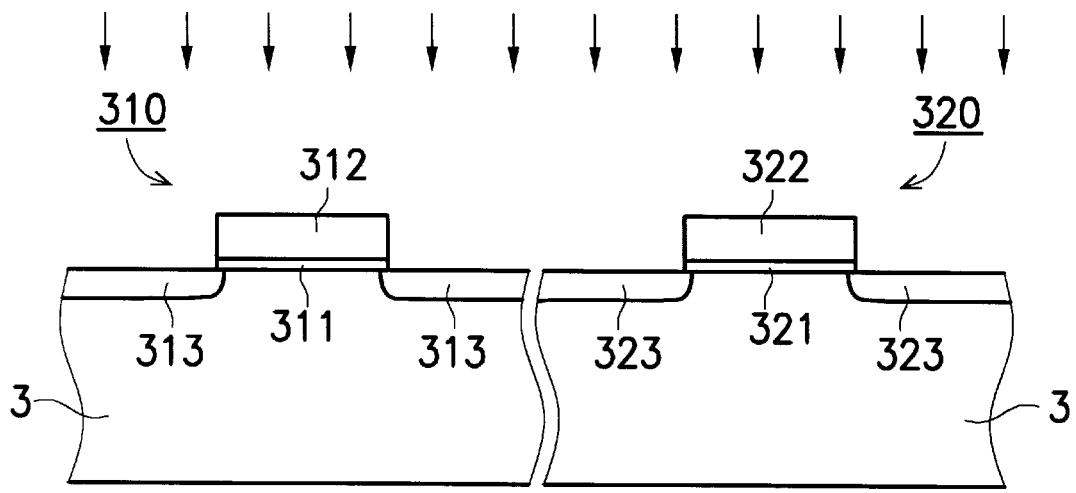
FIG. 3A through FIG. 3D are cross-sectional views illustrating steps for fabricating a conventional electrostatic discharge device.
Figure 3B:
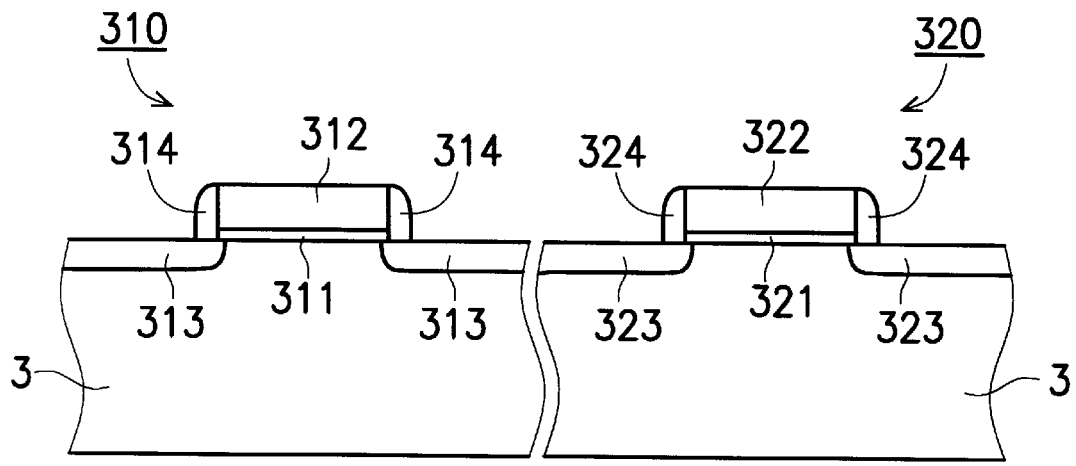
Figure 3C:
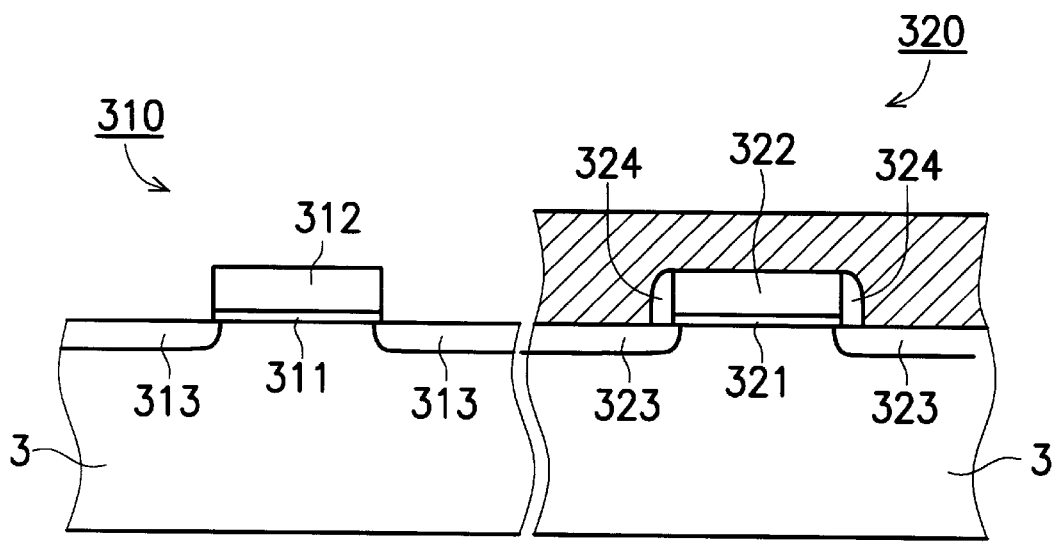
Figure 3D:
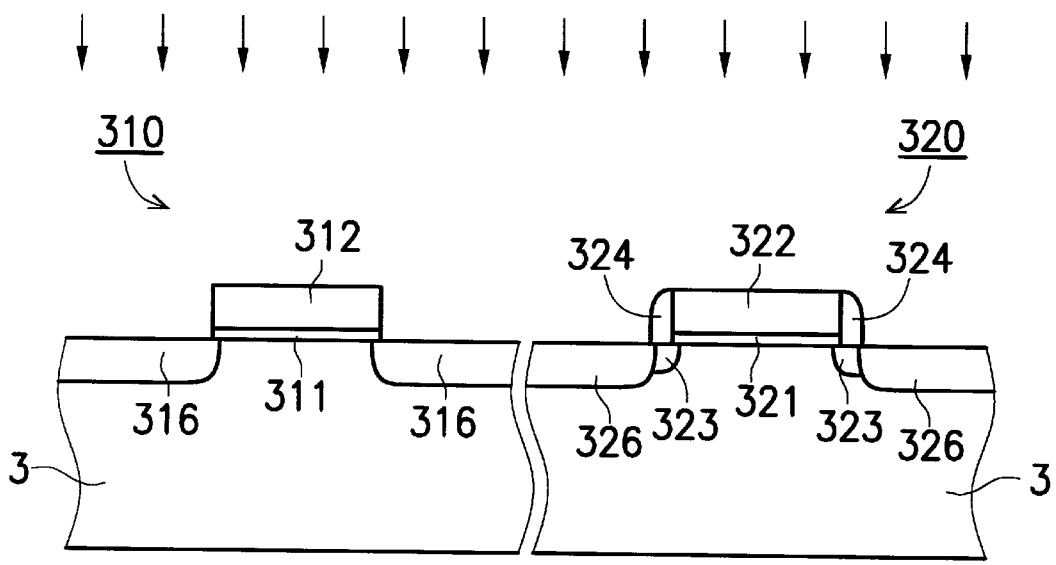
Figure 4A:
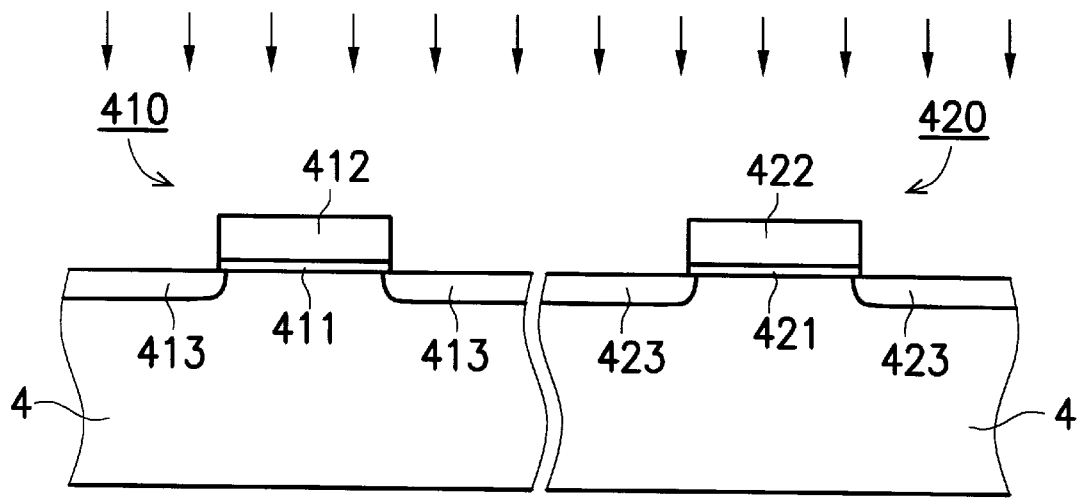
FIG. 4A through FIG. 4D are cross-sectional views illustrating the steps of the method in a preferred embodiment of the invention.

Referring to FIG. 4A, a dielectric layer and a conducting layer are successively formed over the substrate 4. The dielectric layer can be a silicon dioxide layer which is formed by, for example, thermal oxidation method. The silicon dioxide layer can have a thickness of about 30–500 Å. The conducting layer can be a polysilicon layer which is formed by methods such as low-pressure chemical vapor deposition (LPCVD). The polysilicon, which has a thickness of about 1500–4500 Å, can be implanted to improve its conductivity. Both the dielectric layer and the conducting layer are then patterned, by photolithography and etching, to form a gate dielectric layer 411 and a gate electrode 412 in the ESD region 410, and a gate dielectric layer 421 and a gate electrode 422 in the internal circuit region 420. A first ion implantation step is then carried out, by using the gate electrodes 412 and 422, to form a first lightly-doped region 413 in the substrate 4 of the ESD region 410, and lightly-doped region 423 in substrate 4 of the internal circuit region 420. The first ion implantation step can be carried out by implanting phosphorous- or arsenic-contained ions of a dosage of about $5\times10^{12}$–$1\times10^{14}$ atom/cm$^2$ and at an energy of about 20–90 KeV. The first lightly-doped regions 413 and 423 have a junction depth of about 0.02–0.3 μm. After the first ion implantation step, the implanted ions in the substrate 4 are annealed and activated. Therefore, the first lightly-doped regions are somewhat laterally diffused under the gate dielectric layers 411 and 421.

Figure 4B:
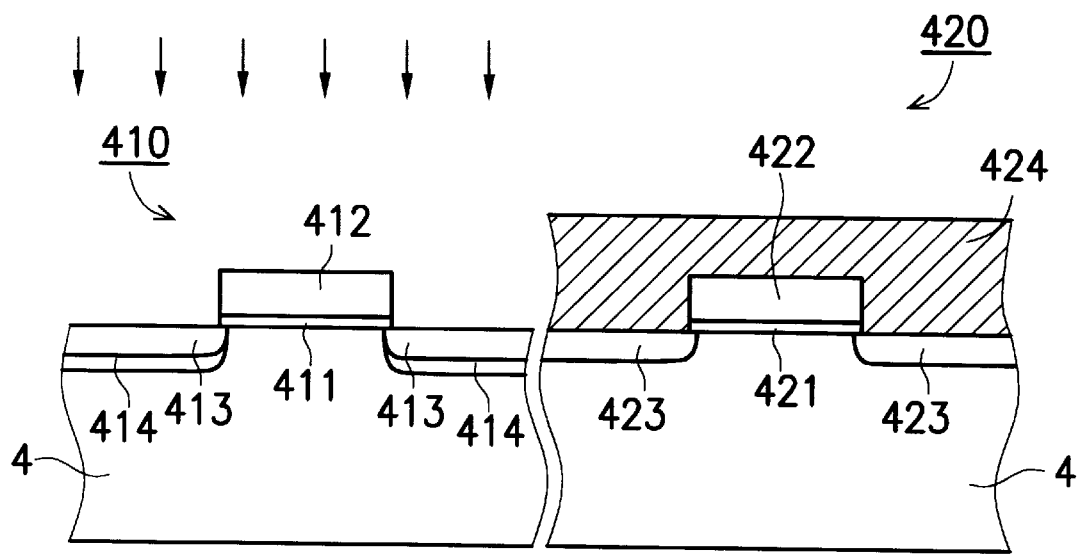

Further referring to FIG. 4B, a photoresist layer 424 is formed over both the ESD region 410 and internal circuit region 420. After removing the photoresist over the ESD region 410, a second ion implantation step is carried out, by using the gate electrode 412 as a mask, to form a second lightly-doped region 414 under the first lightly-doped region 413 in the substrate 4 of the ESD region 410. That is, the second lightly-doped region 414 is deeper than the first lightly-doped region 413 in the substrate 4. The second ion implantation step can be carried out by implanting phosphorous- or arsenic-contained ions of a dosage of about $1\times10^{13}$–$9\times10^{14}$ atom/cm$^2$ and at an energy of about 30–150 KeV. The second lightly-doped region has a junction depth of about 0.05–0.4 μm. The implanted ions in the substrate 4 are then annealed and activated.

Figure 4C:
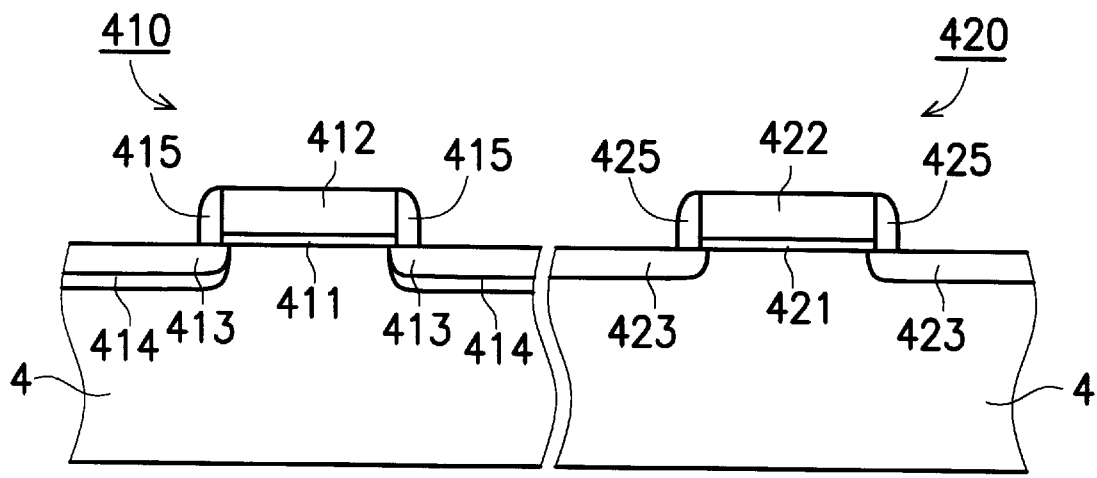

The photoresist layer 424 is then removed. Referring to FIG. 4C, sidewall spacers 415 and 425 are formed on sidewalls of the gate electrode 412 and gate electrode 422, respectively. The sidewall spacers 415 and 425 can be formed by chemical vapor depositing an insulating layer and etching back the layer.

Figure 4D:
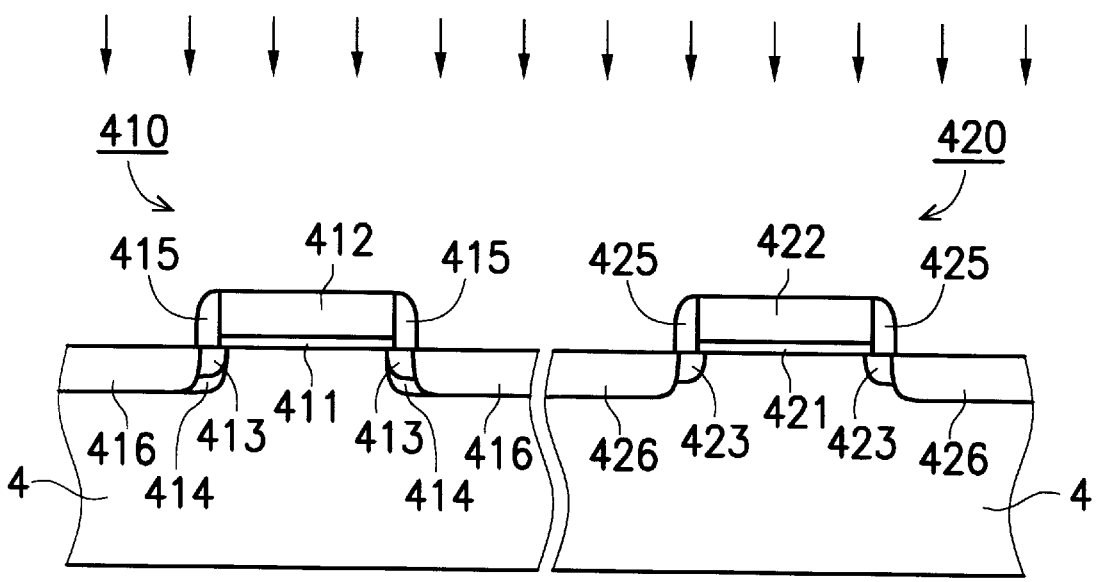

Finally, referring to FIG. 4D, a third ion implantation is carried out, by using the gate electrodes 412 and 422 and the sidewall spacers 415 and 425 as masks, to form heavily-doped regions 416 and 426 in the substrate 4 of the ESD region 410 and the internal circuit region 420. The third ion implantation step can be carried out by implanting phosphorous- or arsenic-contained ions of a dosage of about $1\times10^{14}$–$9\times10^{15}$ atom/cm$^2$ and at an energy of about 20–150 KeV. The heavily-doped regions have a junction depth of about 0.1–1 μm. The implanted ions are then annealed and activated.

Since no additional etching step for removing the sidewall spacer is required in the invention, the gate dielectric layer has higher conformity. As the second lightly-doped region is formed under the first one before the formation of the sidewall spacer, the second ion implantation can be carried out with lower dosage at a lower energy. The manufacturing cost can therefore be reduced. The device fabricated by the method of the invention has a thinner gate electrode of about 1500–2500 Å than a conventional one of about 3000–4500 Å. Moreover, since the electrostatic discharge device of the invention has an LDD structure, the hot carrier effect and the short channel effect can be prevented.

What is claimed is:

1. A method for fabricating an electrostatic discharge device on a semiconductor substrate of a first conductivity type, comprising the steps of:

successively forming a gate dielectric layer and a gate electrode over the semiconductor substrate;

forming a first lightly-doped region of a second conductivity type in the semiconductor substrate through a first ion implantation step which uses the gate electrode as a mask with the first lightly doped region having a first dopant concentration;

after forming the first lightly-doped region, forming a second lightly-doped region of the second conductivity type, with a second dopant concentration and deeper than the first lightly-doped region, directly in the semiconductor substrate without any other doped region between the second lightly doped region and the semiconductor substrate, through a second ion implantation step which uses the gate electrode as a mask and increases the first dopant concentration, resulting in the first lightly doped region having a higher dopant concentration than the second lightly doped region;

forming a sidewall spacer on sidewalls of the gate dielectric layer and the gate electrode; and forming a heavily-doped region of the second conductivity type directly in the semiconductor substrate without any other doped region between the second lightly doped region and the semiconductor substrate, through a third ion implantation step which uses the gate electrode and the sidewall spacer as a mask.

2. The method as claimed in claim 1, wherein the second ion implantation step is carried out by implanting phosphorous- or arsenic-contained ions of a dosage of about $1 \times 10^{13} - 9 \times 10^{14}$ atom/cm$^2$ and at an energy of about 30–150 KeV.

3. The method as claimed in claim 1, wherein the second lightly-doped region has a junction depth of about 0.05–0.4 μm.

4. The method as claimed in claim 1, wherein the first ion implantation step is carried out by implanting phosphorous- or arsenic-contained ions of a dosage of about $5 \times 10^{12} - 1 \times 10^{14}$ atom/cm$^2$ and at an energy of about 20–90 KeV.

5. The method as claimed in claim 1, wherein the first lightly-doped region has a junction depth of about 0.02–0.3 μm.

6. The method as claimed in claim 1, wherein the third ion implantation step is carried out by implanting phosphorous- or arsenic-contained ions of a dosage of about $1 \times 10^{14} - 9 \times 10^{15}$ atom/cm$^2$ and at an energy of about 20–150 KeV.

7. The method as claimed in claim 1, wherein the heavily-doped region has a junction depth of about 0.1–1 μm.

8. The method as claimed in claim 1, wherein the gate electrode has a thickness of about 1500–4500 Å.

9. A method for fabricating an electrostatic discharge device on a semiconductor substrate of a first conductivity type, comprising the steps of:

successively forming a gate dielectric layer and a gate electrode over the semiconductor substrate;

forming a first lightly-doped region of a second conductivity type in the semiconductor substrate through a first ion implantation step with the first region having a first dopant concentration;

after forming the first lightly-doped region, forming a second lightly-doped region of the second conductivity type with a second dopant concentration under the first lightly-doped region in the semiconductor substrate without any other doped region between the second lightly doped region and the well, through a second ion implantation step which increases the first dopant concentration, resulting in the first region having a higher dopant concentration than the second region;

forming a sidewall spacer on sidewalls of the gate dielectric layer and the gate electrode; and forming a heavily-doped region of the second conductivity type directly in the semiconductor substrate without any other doped region between the second lightly doped region and the semiconductor substrate through a third ion implantation step.

10. The method as claimed in claim 9, wherein the second ion implantation step is carried out by implanting phosphorous- or arsenic-contained ions of a dosage of about $1 \times 10^{13} - 9 \times 10^{14}$ atom/cm$^2$ and at an energy of about 30–150 KeV.

11. The method as claimed in claim 9, wherein the second lightly-doped region has a junction depth of about 0.05–0.4 μm.

12. The method as claimed in claim 9, wherein the first ion implantation step is carried out by implanting phosphorous- or arsenic-contained ions of a dosage of about $5 \times 10^{12} - 1 \times 10^{14}$ atom/cm$^2$ and at an energy of about 20–90 KeV.

13. The method as claimed in claim 9, wherein the first lightly-doped region has a junction depth of about 0.02–0.3 μm.

14. The method as claimed in claim 9, wherein the third ion implantation step is carried out by implanting phosphorous- or arsenic-contained ions of a dosage of about $1 \times 10^{14} - 9 \times 10^{15}$ atom/cm$^2$ and at an energy of about 20–150 KeV.

15. The method as claimed in claim 9, wherein the heavily-doped region has a junction depth of about 0.1–1 μm.

16. The method as claimed in claim 9, wherein the gate electrode has a thickness of about 1500–4500 Å.

17. A method for fabricating an electrostatic discharge device on a semiconductor substrate of a first conductivity type, comprising the steps of:

forming a well of a second conductivity type on a portion of the semiconductor substrate;

successively forming a gate dielectric layer and a gate electrode over the well;

forming a first lightly-doped region of the first conductivity type with a first dopant concentration in the well through a first ion implantation step which uses the gate electrode as a mask; thereafter forming a second lightly-doped region of the first conductivity type with a second dopant concentration, deeper than the first lightly-doped region, in the well through a second ion implantation step which uses the gate electrode as a mask and increases the first dopant concentration, resulting in the first region having a higher dopant concentration than the second region;

forming a sidewall spacer on sidewalls of the gate dielectric layer and the gate electrode; and forming a heavily-doped region of the first conductivity type directly in the well without any other doped region between the second lightly doped region and the well through a third ion implantation step which uses the gate electrode and the sidewall spacer as a mask.

* * * * *